United States Patent [19]
Hetzel et al.

[11] Patent Number: 5,490,795
[45] Date of Patent: Feb. 13, 1996

[54] ALIGNING IC SOCKET

[75] Inventors: Kurt C. Hetzel, Phoenix; Jeffery A. Farnsworth, Scottsdale; Patrick H. Harper, Phoenix, all of Ariz.

[73] Assignee: Precision Connector Designs, Inc., Peabody, Mass.

[21] Appl. No.: 260,517

[22] Filed: Jun. 16, 1994

[51] Int. Cl.⁶ .................................................. H01R 11/22
[52] U.S. Cl. ........................................... 439/266; 439/331
[58] Field of Search ....................... 439/68–73, 259–270, 439/330, 331

[56] References Cited

U.S. PATENT DOCUMENTS

| | | | |
|---|---|---|---|
| 5,009,609 | 3/1991 | Matsuoka et al. | 439/264 |
| 5,020,998 | 6/1991 | Ikega et al. | 439/330 |
| 5,288,240 | 2/1994 | Savant | 439/331 |
| 5,304,072 | 4/1994 | Kunioka et al. | 439/266 |

Primary Examiner—Gary F. Paumen
Assistant Examiner—Hien D. Vu
Attorney, Agent, or Firm—Jerry Cohen; Edwin H. Paul; Stephen Y. Chow

[57] ABSTRACT

An aligning socket for an IC that provides an aligning bar that aligns and secures IC leads to the corresponding socket contacts (6), and where the bar has extensions or ears (42) that extend toward the row of IC leads (38). The ears have chamfered edges that, as the bar is forced toward the IC leads, guide the IC leads to mate with the socket contacts. For more fragile gull-winged leads, a rail 18 is provided to support the under side of the leads and the alignment bar ears are designed to fit over the ends of the rail. When the bar and socket contacts are forced toward the IC leads, the bar ears overlap the ends of the rail and force any mis-aligned IC leads to move such that alignment of the leads and the socket contacts is achieved.

4 Claims, 2 Drawing Sheets

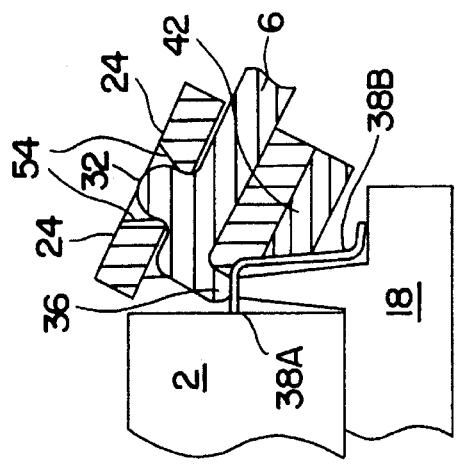
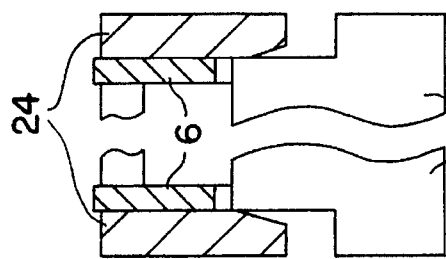
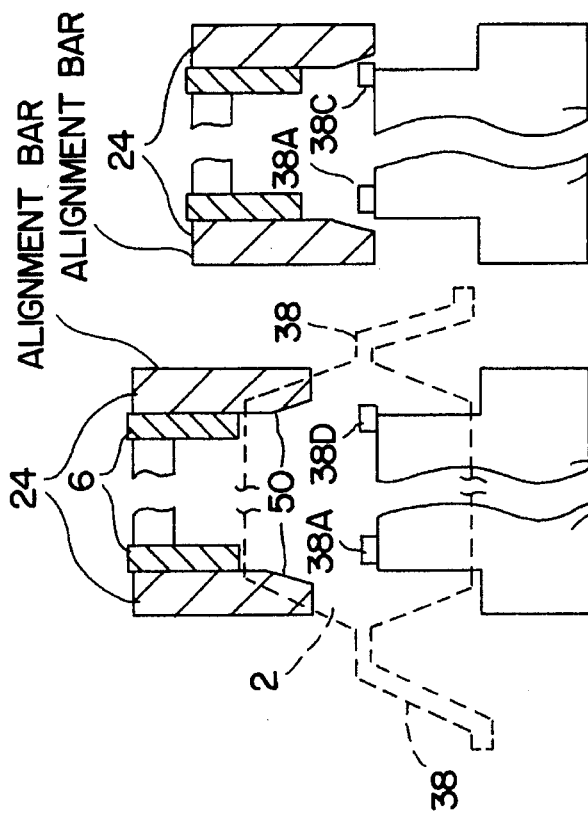
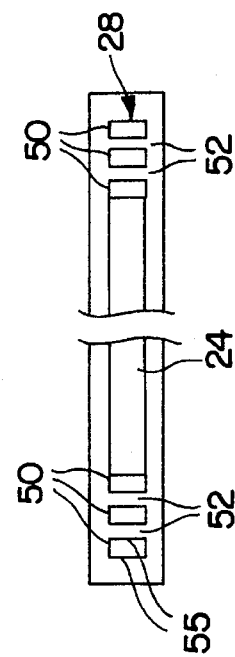
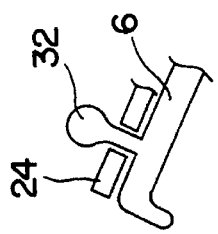

ALIGNING IC SOCKET

FIELD OF THE INVENTION

The present invention relates generally to sockets for surface mount integrated circuits (ICs). The present invention has particular application for sockets that are soldered to a printed circuit board (PCB) and that accept an IC. Such a socket allows the IC to be removably mounted to the board without soldering.

BACKGROUND OF THE INVENTION

An IC socket accepts an IC (herein, IC is defined as the commercially sold product being a packaged chip or die with electrical leads available for making external connections—not the chip or die itself), makes electrical contact with the leads of the IC, and provides electrical connections to the printed circuit board to which the socket is soldered or otherwise attached. Of critical importance to all sockets is the ability to reliably align the IC leads and the socket contacts. This is especially true of sockets for fine pitch surface mounted ICs where there are many narrow IC leads arranged close to each other on each side of the IC package. Such ICs have rows of leads that may extend over one or more inches in length.

Some IC sockets for surface mount ICs align the IC leads to the socket contacts by providing fixed mechanical posts, protrusions or the like that guide and position the IC package within the socket cavity. One such means provides for locator posts for each of the four corners of the IC package. As the IC is fitted into the cavity, the locator posts guide the corners to positions where the IC is in a mechanically controlled, known position so that the IC leads will be aligned with the socket contacts.

Other sockets use mechanical protrusions that form a cavity under the IC package where rails extend upward from the base to accept each of the four underneath edges (as compared to the corners of the previous paragraph) of the IC package. When the IC package is fitted to this cavity the IC package is aligned to the socket at a known location designed to ensure that the IC leads and the socket contacts are aligned.

In both of the above described sockets, the IC package, when the IC is inserted into the socket cavity, conforms to the molded body of the socket. Thus, in both of these configurations the mechanical tolerances of the IC package and the socket are factors that directly affect the alignment quality of the socket/IC combination. As a result, damage to the fragile IC leads may occur. The mechanical tolerance chain is as follows: (1) the IC lead size, (2) the IC lead to the IC package corners and/or edges, (3) the fitting of IC package to the rails or corner posts of the socket, (4) the rails or corner posts to the location of the socket contact locations, and (5) the location of the socket contacts within the contact locations. This chain of tolerances must be controlled and maintained to tight dimensions—the lack of such control will contribute to socket failure and unreliability.

An object of this invention is to provide an IC socket system with improved alignment of the IC leads to the socket contacts.

It is another object of this invention to reduce the damage to IC packages when used with a socket.

SUMMARY OF THE INVENTION

The foregoing objects are met in a socket for ICs, the ICs having electrical contacts arranged in linear rows, including: a base with a cavity that accepts an IC, a plurality of contacts constructed and arranged within the base, said contacts having extensions for making electrical connections to the rows of IC leads, alignment bars where each such bar extends beyond at least one lead from a row of IC leads, although overlapping several leads or the two end leads of the entire row are preferred embodiments, the bar having extensions that matingly overlap at least one IC lead from a row, said alignment bar fixed in relation to the socket contacts such that mating the bar with the IC leads, with the IC leads between the base and the bar, aligns the IC leads and the socket contacts. The IC is movable within the socket to allow the bar, as it mates with the IC leads, to force the IC package to a position where the IC leads align with the socket contacts.

In a preferred embodiment the alignment bar extends over the entire length of a row of IC leads, and the bar extensions overlap at the end leads of the row.

In a preferred embodiment to accommodate fragile gull-winged IC leads, the present invention includes a rail that fits between the row of IC leads and the body of the IC package on the underside of the row of IC leads, the rail extending the length of the row of IC leads. In this embodiment, the alignment bar extensions are manufactured to fit closely over the ends of the rail and the row of IC leads. In operation with IC leads mis-aligned to the socket, the remote ends of the row of IC leads overlap the ends of the rail, and, as the alignment bar is fitted over the IC leads and the rail, the alignment bar extensions contact the overlapping IC lead and moves the IC such that the two remote leads align with the ends of the rail. In this configuration the IC leads and the socket contacts are aligned. An advantage of this system is that the IC leads are directly contacted by the alignment bar and the tolerance chain discussed above is shortened to the alignment bar and the IC leads directly. In the present invention, when applied to an IC having J leads, the rail is not necessary as the IC J leads themselves are rugged enough and need no additional support.

In a preferred embodiment the alignment bar has locators constructed with grooves or through holes to accept protrusions from the socket contacts such that the bar snaps onto the socket contacts. The grooves have separators or webs of material between each groove to separate and retain the contacts within the alignment locators to ensure that the socket contacts remain in position to align with the IC leads.

Other objects, features and advantages will be apparent from the following detailed description of preferred embodiments thereof taken in conjunction with the accompanying drawing in which:

BRIEF DESCRIPTION OF THE DRAWINGS

FIG. 2A, 2B, 2C, 2D and 2E are diagrammatic views of the alignment bar/rail mechanism, FIG. 3 is a detail of the alignment bar of the present invention.

DETAILED DESCRIPTION OF PREFERRED EMBODIMENTS

Figure 1:
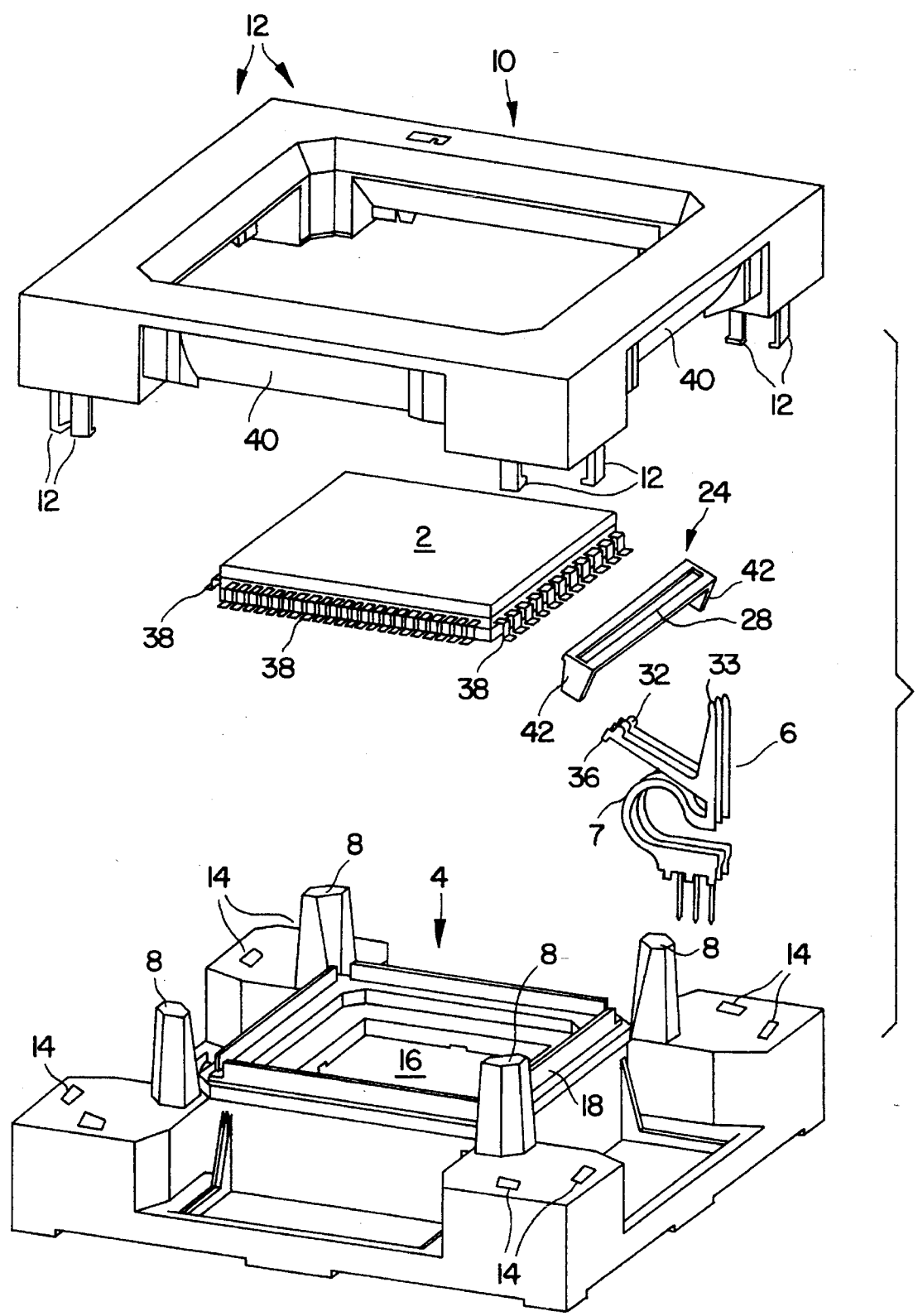
FIG. 1 is a perspective view of a socket made in accordance with the present invention.

FIG. 1 shows a socket designed to accept a square or rectangular gull-winged leaded IC package 2. The base 4 is one piece molded of a commonly used material known in the industry, e.g., polysulfone, polyarylsulfone, polyethersulfone. Representative electrical contacts 6 are shown, the contacts extend around each side of the IC package. The bend of the contacts 7 provide a spring action, and the electrical contact material used in the sockets may be any of those commonly used in the industry, e.g., beryllium copper, phosphor bronze. Normally there is one socket contact for each IC lead, but other ratios of more or less than one-to-one may be found in the art. The base 4 has four corner posts 8 that extend upward and align the lid 10. In this embodiment the lid has downward facing flexible (to allow manual removal of the lid) "snap" extensions 12 that mate with recesses 14 in the base to retain the lid to the base. With the base mated to the lid, a cavity 16 is formed where the IC package 2 is held.

A rail structure 18 is also in the cavity to provide lead support for the gull-winged IC 2. The rails 18 lie beneath the IC package with the rails extending upward between the IC package body and the row of gull-wing leads. The rail structure may be molded as part the base 4, or in other preferred embodiments, as a separate structure joined with adhesive or mechanically to the base.

An alignment bar 24 is shown for one side of the socket assembly—such bars may be used on each of the other three sides, but are not shown. The alignment bar 24 has longitudinal slots 28 that are constructed to retain the socket contacts 6. The slot are constructed to snap onto the protrusions 32 of the contact pins 6. Extensions are provided at the ends of the alignment bar that will fit over the IC leads to force alignment as described below.

In this preferred embodiment, the lid 10 has four canted surfaces 40 such that when the lid is forced downward toward the base, the surfaces 40 strike the upper extensions 33 of the contacts 6 and force the contacts to flex away from the cavity allowing the IC package to be inserted into the cavity 16 without interference from the contacts. When assembled, the underneath of the IC gull-wing leads rests on the rails 18. The alignment bar 24 is attached to the outside of the socket contacts at protrusions 32 directly adjacent to the point of electrical contact 36 between the contact and the IC leads 38. The intimate relation of the alignment bar and the actual electrical contact point between the socket contacts and the IC leads enhances the desired alignment on the contacts and the IC leads. A second alignment bar (not shown) may be provided to attach to the lower outside edges of the contacts 6—this bar provides added inter-contact support for the row of contact pins to maintain the contacts separate from each other as the lid forces the contacts apart—defined as the open position. As stated before, these alignment bar 24 may be used on all four sides of the socket although only one side is shown. The lid may be raised, say by springs (not shown) as is known in the art, where the lid surfaces 40 no longer force the contacts 6 apart—defined as the closed position. The spring contacts 6 converge toward the cavity and make electrical contact with the IC leads. The ears or extensions 42 of the alignment bar 24 overlap and mate with the ends of the rails 18. If the remote end IC leads extend over the ends of the rails, the extensions 42 move the entire IC package such that the remote end leads of the row of IC leads align with the end of the rail. In summary, the IC package position conforms to allow alignment of the IC leads to the rail ends, the alignment bar ears, and so to the socket contacts.

FIGS. 2A–2D show the above alignment in more detail. The IC package is shown dotted in FIG. 2A. The leads 38 of the IC are shown extending out. The row of IC leads coming directly out of the page are shown in cross section 38A and 38B as these leads emerge from the IC package itself. The lead 38A is the most left lead of the row and 38B is the most right lead. The rail 18 lies below and supports the leads. FIG. 2A shows the alignment bar with chamfered end ears 42. In FIG. 2B the chamfers 50 are in contact with the mis-aligned IC lead 38B. As the bar 24 is forced farther down onto the rail as in FIG. 2C, the chamfer 50 drives the lead 38B (and the whole IC package) such that the lead 38B is aligned with the edge of the rail and the alignment bar. FIG. 2C shows the final aligned position. FIG. 2D is a section through IC lead 38B (the far right lead of FIGS. 2A–2C), the view of FIG. 2D is looking down the row of leads (a side view compared to FIG. 2A–C). The socket contact 6 is shown with the protrusion 32 holding the contact to the alignment bar 24. The far end extension or ear 42 of the alignment bar is shown below the contact. The contact electrical connection point 36 is in physical contact with the lead and the lead is supported by the rail 18.

FIG. 3 shows the alignment bar from the top in detail. The slot 28 is composed of through holes 50 separated from each other by material 52. One or or more of the holes are constructed with chamfers 54 (of FIG. 2D) to mate and snap or lock onto the contact extension 32. Other attachment/alignment means include: a chamfer on one surface and a close fit on the other surface, chamfers of the other sides 55 of the through holes, a separate insert that locks the contacts to the alignment bar, and a thinner bar 24 and/or a longer necked extension 32 such that the bar completely snaps onto the extensions as in FIG. 2E.

If the IC package has J-leads the rail 18 is not needed. The J-leads are rugged enough such that the J-leads need only lie of a flat surface of the base socket with a gross alignment be accomplished by the post technique as described above. This gross alignment positions the J-leads close enough such that the alignment bar 24 attached to the socket contacts as in FIG. 2D (consider the rail 18 not present and the gull-wing lead to be J-leads) will contact mis-aligned J-leads on the chamfer 50 surfaces (FIG. 2A) and move the J-leads and the IC package into alignment with the contacts of the socket.

Other types of leads and IC packages may benefit from the present invention with minor, known in the skill of the art, modifications.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. A socket for ICs comprising:

(a) a base with a cavity that accepts an IC package with leads extending away from said package in a first direction for a distance and there said leads are bent and extend at about ninety degrees from said first direction, said leads defining rows, each said row having a length with remote ends, (b) a plurality of contacts constructed and arranged within the base, said contacts, formed in rows matching said lead rows and having extensions for making electrical connections to said leads, (c) a discrete alignment bar that extends along the length of each lead row, and aligns each contact with a respective lead said bar having ears that matingly overlap the remote ends of said row of leads, (d) a rail of said base that fits between the bent portion of said leads and the package, said rail extending along said length of said row of leads, and said rail contacting said leads adjacent to the package to support the leads as the socket contacts make physical and electrical connections to said leads, said rail having a first and a second end constructed to mate with said ears.

2. A socket for ICs comprising:
(a) a base with a cavity that accepts an IC package with leads extending away from said package a first direction for a distance and there said leads are bent and extend at about ninety degrees from said first direction, said leads defining rows, each said row having a length with remote ends,
(b) a plurality of contacts constructed and arranged within the base, said contacts, formed in rows matching said lead rows and having extensions for making electrical connections to said leads
(c) a discrete alignment bar that extends along the length of each lead row, said bar having ears that matingly overlap the remote ends of said row of IC leads, where each said ear comprises an extension from said alignment bar into the row defined by said leads, where the extension has a first surface that faces generally said lead row, said first surface of the ears being chamfered such that as the alignment bar is driven toward said leads said first surfaces contact said leads and force said leads into positions defined between said chamfered surfaces to align each contact with a corresponding lead.

3. A socket for ICs comprising:
(a) a base with a cavity that accepts an IC package with leads extending away from said package a first direction for a distance and there said leads are bent and extend at about ninety degrees from said first direction, said leads defining rows, each said row having a length with remote ends,
(b) a plurality of contacts constructed and arranged within the base, said contacts, formed in rows matching said lead rows and having extensions for making electrical connections to said leads
(c) a discrete alignment bar that extends along the length of each lead row, said bar having extensions or ears that matingly overlap the remote ends of said row of leads, wherein said bar includes a member formed substantially longitudinally parallel to said lead row, said bar having locators that accept the socket contacts and separate and secure the socket contacts to said bar, and where each socket contact has a protrusion constructed to matingly fit into the locators such that each contact remains separate from each other and where the contacts are fixed to said bar to align each contact with a corresponding lead.

4. A socket as defined in claim 3 where the locators are grooves or through holes that are separated from each other by webs of said package material.

* * * * *